United States Patent [19]

Kumar et al.

[11] Patent Number: 4,810,917
[45] Date of Patent: * Mar. 7, 1989

[54] DIGITAL RESOLVER/ENCODER ASSEMBLY

[75] Inventors: Shalabh Kumar, Kildeer; Keith R. Johnson, Orland Park, both of Ill.

[73] Assignee: Autotech Corporation, Carol Stream, Ill.

[*] Notice: The portion of the term of this patent subsequent to Mar. 1, 2005 has been disclaimed.

[21] Appl. No.: 158,659

[22] Filed: Feb. 22, 1988

Related U.S. Application Data

[63] Continuation of Ser. No. 738,411, May 28, 1985, Pat. No. 4,728,834.

[51] Int. Cl.⁴ .................... H02K 11/00; H02K 23/66
[52] U.S. Cl. .................... 310/68 R; 29/596; 29/602.1; 29/841; 310/43; 310/89; 310/DIG. 6; 361/395; 341/112
[58] Field of Search ............ 29/596, 598, 602.1, 29/841; 310/68 R, 43, 89, 71, DIG. 6; 340/347 M, 347 P, 347 DD; 361/395

[56] References Cited

U.S. PATENT DOCUMENTS

| | | |
|---|---|---|
| 3,963,919 | 6/1976 | Sells . |
| 4,456,844 | 6/1984 | Yamamoto et al. ............ 310/87 |
| 4,603,238 | 7/1986 | Griswold et al. . |
| 4,728,834 | 3/1988 | Kumar et al. ............ 310/68 R |

FOREIGN PATENT DOCUMENTS 55-53154  4/1980  Japan .
55-111656  8/1980  Japan .

*Primary Examiner*—Carl E. Hall
*Attorney, Agent, or Firm*—Thomas R. Vigil

[57] ABSTRACT

The method of forming a compact resolver/encoder assembly which is impervious to moisture, comprises several steps. First a number of electronic components of the resolver/encoder are mounted on a flexible printed circuit board. The circuit board is then folded into a generally cylindrical envelope and placed in a generally cylindrical container having a closed bottom end and an upper open end. The folded circuit board tens to unfold against the inner surface of the cylindrical wall of said container. Then a form made of stiff but flexible paperboard is inserted within the cylindrical envelope and tends to unfold to take on a tear drop cross section. Next a heat insulating potting compound is inserted into the generally annular space in the container between the form and the cylindrical wall of the container where the folded, printed circuit board is located. The potting compound is allowed to set around the circuit board with a generally cylindrical space defined within the form in the middle of the container. Finally, a stator and rotor assembly are mounted within the cylindrical space and fixed to the container.

6 Claims, 2 Drawing Sheets

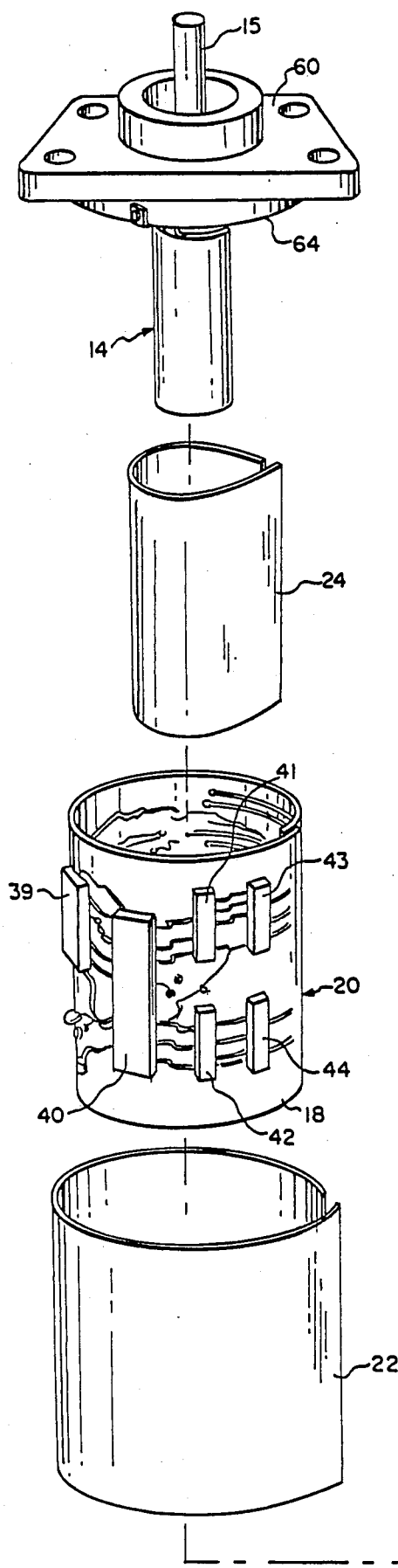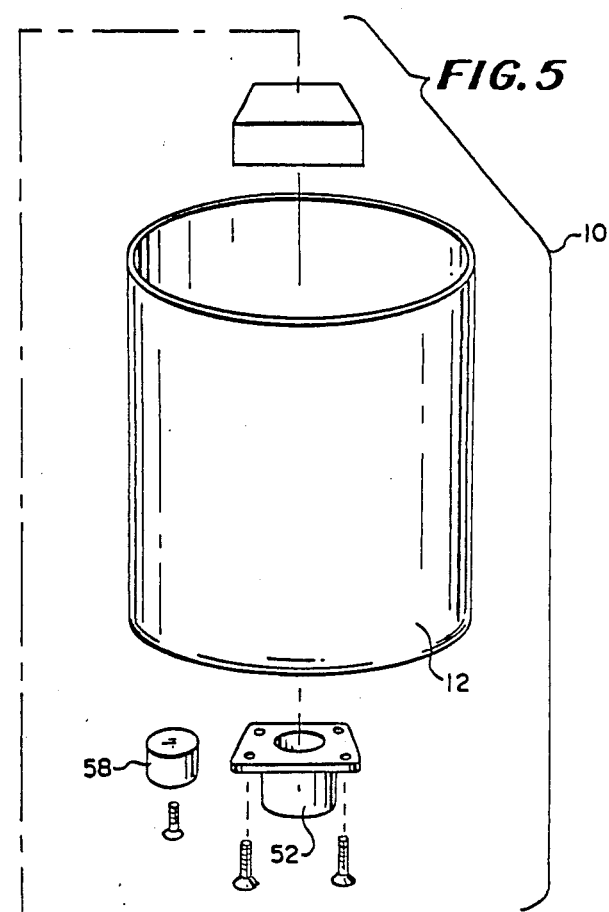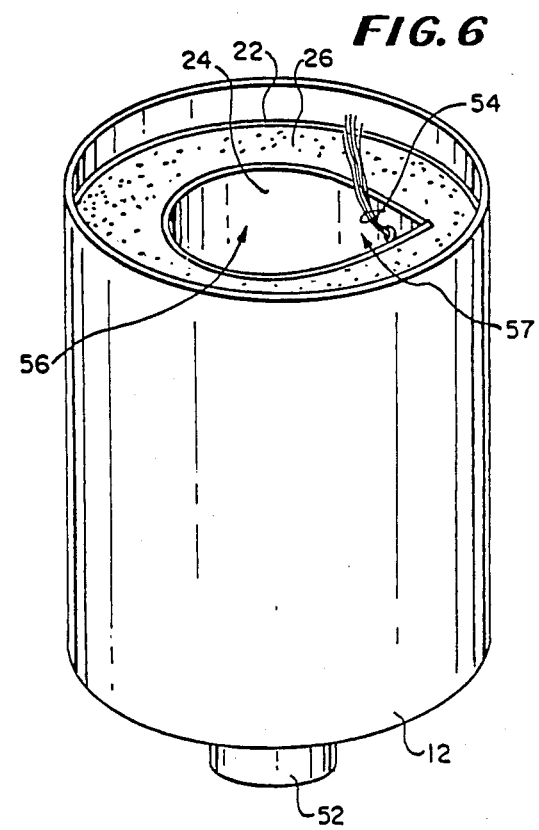

DIGITAL RESOLVER/ENCODER ASSEMBLY

This is a continuation of application Ser. No. 738,411, filed May 28, 1985 now issued to U.S. Pat. No. 4,728,834 granted Mar. 1, 1988.

BACKGROUND OF THE INVENTION

1. Field of the Invention

The present invention relates to a compact resolver/encoder assembly.

2. Description of the Prior Art

Heretofore resolver/encoder assemblies have been proposed which include a stator housing with a rotor journalled therein and an external electronic circuit board having electronic components electrically coupled to the stator and rotor windings of the resolver/encoder.

Such assemblies were bulky, required connections between the stator housing and the circuit board, and were subject to harmful environmental conditions, e.g., moisture.

As will be described in greater detail hereinafter, the resolver/encoder assembly of the present invention differs from the previously proposed resolver/encoder assemblies by providing a compact assembly having all the major components thereof mounted in a resolver/encoder housing through use of a flexible printed circuit board which can be rolled or coiled into a generally cylindrical configuration and mounted in the resolver/encoder housing.

SUMMARY OF THE INVENTION

According to the invention there is provided a method for constructing a resolver/encoder comprising the steps of: mounting a number of electronic components of the resolver/encoder on a flexible printed circuit board; folding the circuit board into a generally cylindrical envelope; placing said folded circuit board in a generally cylindrical containing having a closed bottom end and an upper open end, said folded circuit board tending to unfold against the inner surface of the cylindrical wall of said container; inserting an electrical insulating potting compound into said container in a generally annular space in said container which is adjacent the cylindrical wall of the container and which has said circuit board therein; allowing said potting compound to set around said circuit board with a generally cylindrical space formed and defined within the middle of said container, and mounting a stator and rotor assembly in said cylindrical space in the container.

Further according to the invention there is provided a resolver/encoder comprising: a flexible printed circuit board; a number of electronic components of the resolver/encoder mounted on said flexible printed circuit board; a generally cylindrical container having a closed bottom end and an upper open end, said circuit board being folded into a generally cylindrical envelope and being received adjacent a cylindrical wall of said container, an electrical insulating potting compound situated in a generally annular space in said container and surrounding said circuit board in a manner so as to Further there is provided a compact digital resolver/encoder assembly comprising: a resolver; a flexible printed circuit board having an inner side and an outer side; a number of electronic components for decoding the resolver being mounted on said flexible printed circuit board; a generally cylindrical container having a cylindrical wall; said circuit board being received in said container, being folded into a shape which will fit into said container around said resolver, being insulated on said inner side from said resolver, and being insulated on said outer side from said container; and said resolver being received in said container and being spaced a predetermined distance from said circuit board.

Also, there is provided a compact digital resolver/encoder assembly comprising: a resolver; a flexible printed circuit board having an inner side and outer side; a number of electronic components for decoding the resolver being mounted on said flexible printed circuit board; a generally tubular enclosure; said circuit board being received in said enclosure, being folded into a shape which will fit into said enclosure around said resolver, being insulated on said inner side from said resolver, and being insulated on said outer side from said enclosure; and said resolver being received in said enclosure and being spaced a predetermined distance from said circuit board.

Additionally there is provided a compact digital resolver/encoder assembly comprising a resolver; a flexible circuit board; electronic circuitry for decoding the resolver being formed in at least one integrated circuit chip mounted on said flexible circuit board; a container having a cylindrical wall; said integrated circuit chip and flexible circuit board being received in said container adjacent said cylindrical wall of said container; said resolver being mounted in said container separate and spaced from said circuit board; and said integrated circuit chip being insulated from said resolver and from said container.

Still further there is provided a compact digital resolver/encoder assembly comprising a resolver; a flexible circuit board; electronic circuitry for decoding the resolver being formed in at least one integrated circuit chip mounted on said flexible circuit board; a tubular enclosure; said integrated circuit chip and circuit board being received in said enclosure adjacent an inner wall of said enclosure; said resolver being mounted in said enclosure separate and spaced from said circuit board; and said integrated circuit chip being insulated from said resolver and from said enclosure.

And still further there is provided a compact digital resolver/encoder comprising: a resolver; a flexible circuit board having an inner side and an outer side; a number of electronic components for decoding said resolving being mounted on said flexible printed circuit board; a generally cylindrical container having a cylindrical wall; said circuit board being received in said container, being folded into a shape which will fit into said container around said resolver, being insulated on said inner side from said resolver, and being insulated on said outer side from said cylindrical wall of said container; said resolver being received in said container separate from said circuit board and being spaced a predetermined distance from said printed circuit board; and an electrical connection including flexible insulated wire conductors coupling said resolver to said printed circuit board.

Still yet there is provided a compact digital resolver/encoder comprising: a resolver; a flexible circuit board having an inner side and an outer side; a number of electronic components for decoding the resolver being mounted on said flexible printed circuit board; a tubular enclosure; said circuit board being received in said tubular enclosure, and being folded into a shape which will fit into said enclosure and around said resolver, being insulated on said inner side from said resolver, and being insulated on said outer side from said enclosure; said resolver being received in said enclosure separate from said circuit board and being spaced a predetermined distance from said printed circuit board; and an electrical connection including flexible insulated wire conductors coupling said resolver to said printed circuit board.

BRIEF DESCRIPTION OF THE DRAWINGS

FIG. 5 is an exploded perspective view of the resolver/encoder assembly of the present invention.

FIG. 6 is a perspective view of the assembled parts of the stator of the resolver/encoder assembly of the present invention.

DESCRIPTION OF THE PREFERRED EMBODIMENT

Figure 1:
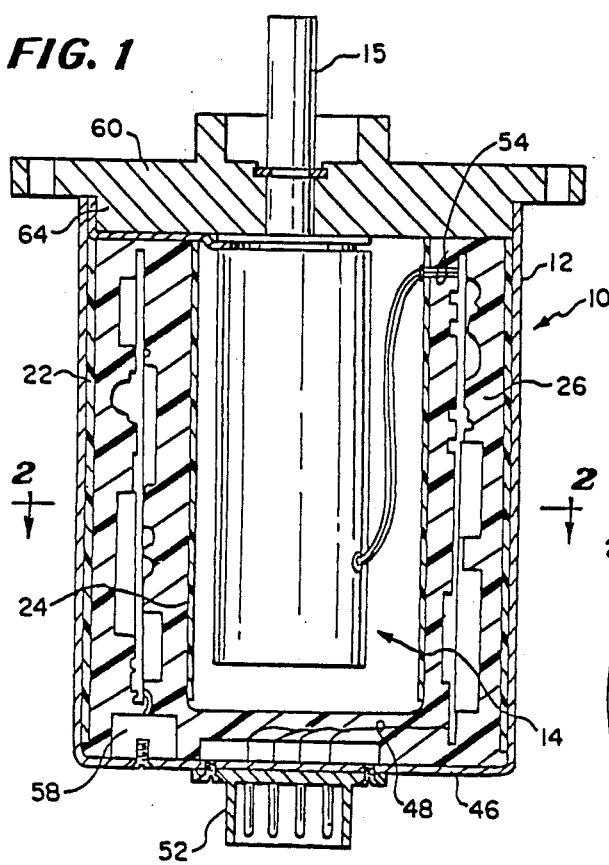
FIG. 1 is an axial sectional view of the resolver/encoder assembly of the present invention.

Referring now to the drawings in greater detail there is illustrated in FIG. 1 a resolver/encoder assembly 10. The resolver/encoder assembly 10 includes a cylindrical housing or container 12 containing a resolver 14 having a stator and rotor assembly therein (not shown) connected to a shaft 15. Such resolvers are well known in the art as resolvers, resolver transducers or transducers and transduce each shaft angle position to a unique analog signal.

The resolver/encoder assembly 10 also includes a control circuit 16 (FIG. 3) which, in accordance with the teachings of the present invention, is mounted on a flexible printed circuit board 18 with circuitry on both sides.

Figure 4:
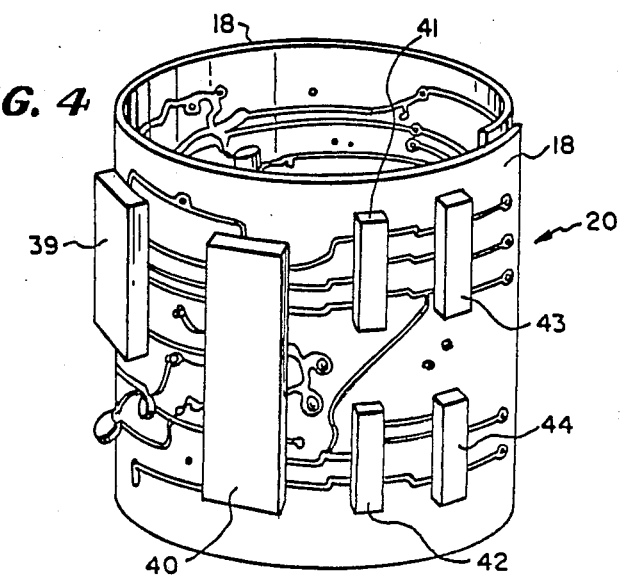
FIG. 4 is a perspective view of the flexible printed circuit board in its folded position.

Further in accordance with the teachings of the present invention and as will be described in greater detail hereinafter, the flexible printed circuit board 18 is folded, rolled or coiled into a generally cylindrical envelope or shape 20 (FIGS. 2, 4 and 5) and inserted in the cylindrical housing 12 and fixed therein between an outer or coiled sheet of insulation or insulator 22 and an insulator or form 24 defined by an inner coil sheet of insulation 24, by a potting compound 26 to provide a compact resolver/encoder assembly 10.

Figure 3:
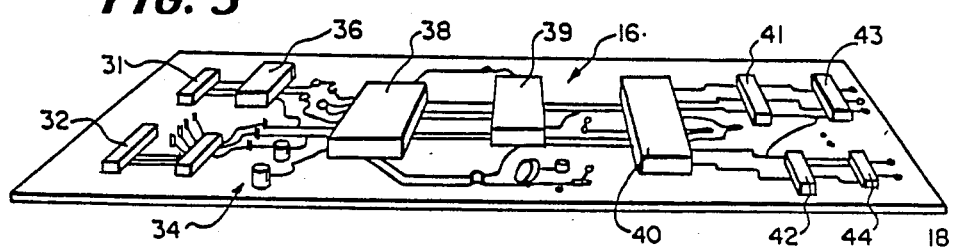
FIG. 3 is a perspective view of a flexible printed circuit board of the assembly in its unfolded position.

As best shown in FIG. 3, the printed circuit board 18 has affixed to it various electronic components which form the electrical circuit 16. These components are chosen to have values which function and operate to, and are arranged to minimize heat generation within the circuit 16. Typically such circuit 16 includes input buffers 31 and 32 for selecting different input signals, an oscillator circuit 34 for generating clock signals, a DC to DC converter 36, a hybrid resolver tracking converter 38, a high address decoding PROM 39, a low address decoding PROM 40, latching circuits 41 and 42, and buffer/driver circuits 43 and 44.

In accordance with the teachings of the present invention, the flexible printed circuit board 18 (FIG. 3) is folded to the generally cylindrical shape 20 (FIG. 4) to facilitate insertion thereof into the cylindrical housing 12 above a bottom wall 46 thereof and between the insulators or forms 22 and 24. Then a potting compound 26 is inserted in the space or area between the forms 22 and 24 above the housing bottom wall 46.

As shown in FIG. 1, the printed circuit board 18 has electrical wire conductors 48 connected thereto and to a multi-terminal connector 52 which is fixed to the bottom wall 46 of the cylindrical housing or container 12.

The flexible printed circuit board 18 also has electrical wire conductors 54 connected thereto and to the stator and rotor assembly 14 as shown in FIG. 1.

It is also to be understood that the electrical wire conductors 54 are sufficiently long to allow the resolver 14 to be positioned outwardly of the cylindrical container 12 when the potting compound 26 is being inserted into the container 12 for surrounding and insulating the printed circuit board 18.

Figure 2:
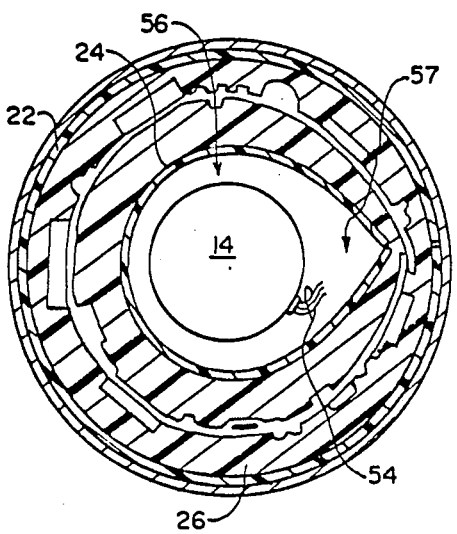
FIG. 2 is a radial sectional view of the resolver/encoder assembly shown in FIG. 1 and is taken along line 2—2 of FIG. 1.

As shown in FIGS. 1 and 2, the potting compound 26 has the printed circuit board 18 embedded therein to electrically insulate the electrical components 31–44 of the circuit 16 and renders them impervious to moisture. Typically the potting compound 26 is R.T.V., an epoxy or any other suitable type of potting compound.

The form 24 which forms a space with a tear drop cross section is used to provide a cylindrical space 56 which allows placement of the resolver 14 inside the cylindrical container 12 and an eccentric space 57 for the wire conductors 54. The form 24 is made of any flexible material which will provide for such a tear drop cross section, such as flexible paper board.

Also, as shown in FIG. 1, the circuit 16 includes a voltage regulator 58 which is fixed to the bottom wall 46 of the cylindrical container 12 which serves as a heat sink for the heat generated by the voltage regulator 58. The flexible printed circuit board 18 in coiled form 20 is positioned above the voltage regulator 58 and separated from the heat generating voltage regulator 58 before the potting step and afterwards by the potting compound 26.

The insulator or form 22 adjacent to the inner surface of the cylindrical container 12 is inserted before the potting step to ensure that there is no short circuit between the coiled 20 flexible printed circuit board 18 and the cylindrical container 12.

The resolver 14 includes an end flange 60 from which the rotor shaft 15 extends. The flange 60 has an annular shoulder 64 on the underside thereof which can be press fit into the upper open end of the container 12.

The method for assembling the resolver/encoder assembly 10 is shown in FIG. 5 and described as follows:

First the multi-terminal connector 52 is secured to the bottom wall 46 of the cylindrical container 12 by means of suitable fasteners, e.g., screws.

Then the insulator or form 22 is inserted inside the cylindrical container 12 and if desired, can be affixed to the inner wall of the cylindrical container 12 by an adhesive or other means.

Next, the flexible printed circuit board 18 is coiled to the form 20 and inserted into the cylindrical container 12 and is electrically coupled to the multi-terminal connector 52 by the wire conductors 48.

At the same time or previously, the flexible printed circuit board 18 is electrically coupled to the resolver 14 by the wire conductors 54. Also at the same time or previously, the voltage regulator 58 is electrically coupled to the flexible printed circuit board 18. Then, after the folded printed circuit board 18 and regulator 58 are inserted into the container 12, the voltage regulator 58 is secured to the bottom wall 46 by a fastener such as a screw.

The form 24 is now inserted inside the coiled/folded flexible printed circuit board 18 and the potting compound 26 is placed between the form 24 and the insulator 22 over the flexible printed circuit board 18.

Finally, the resolver 14 is placed in the cylindrical space 56 with the wire conductors 54 in the space 57 and the shoulder 64 of the flange 60 press fitted into the container 12.

From the foregoing description, it will be apparent that the method for fabricating a resolver/encoder assembly 10 described above and the assembly 10 formed thereby has a number of advantages, some of which have been described above and others of which are inherent in the invention. Specifically, the method of the present invention allows a manufacturer to simply, quickly and inexpensively fabricate a compact resolver/encoder assembly with a stator and rotor assembly and an electronic circuit 16 encased in a container 12 with the circuit 16 insulated from moisture and impervious thereto.

Also, it will be apparent from the foregoing description that modifications can be made to the method of fabricating a resolver/encoder assembly 10 and the assembly 10 formed thereby without departing from the teachings of the present invention. For example, the electronic components of the resolver/encoder assembly can be incorporated into one or more integrated circuit chips mounted onto a flexible circuit board which is then inserted in the container 12 and insulated from adjacent metal surfaces. Accordingly, the scope of the invention is only to be limited as necessitated by the accompanying claims.

I claim:

1. A compact digital resolver/encoder assembly comprising: a resolver; a flexible printed circuit board having an inner side and an outer side; a number of electronic components for decoding the resolver being mounted on said flexible printed circuit board; a generally cylindrical container having a cylindrical wall; said circuit board being received in said container, being folded into a shape which will fit into said container around said resolver, being insulated on said inner side from said resolver, and being insulated on said outer side from said container; and said resolver being received in said container and being spaced a predetermined distance from said circuit board.

2. A compact digital resolver/encoder assembly comprising:
a resolver; a flexible printed circuit board having an inner side and outer side; a number of electronic components for decoding the resolver being mounted on said flexible printed circuit board; a generally tubular enclosure; said circuit board being received in said enclosure, being folded into a shape which will fit into said enclosure around said resolver, being insulated on said inner side from said resolver, and being insulated on said outer side from said enclosure; and said resolver being received in said enclosure and being spaced a predetermined distance from said circuit board.

3. A compact digital resolver/encoder assembly comprising a resolver; a flexible circuit board; electronic circuitry for decoding the resolver being formed in at least one integrated circuit chip mounted on said flexible circuit board; a container having a cylindrical wall; said integrated circuit chip and flexible circuit board being received in said container adjacent said cylindrical wall of said container; said resolver being mounted in said container separate and spaced from said circuit board; and said integrated circuit chip being insulated from said resolver and from said container.

4. A compact digital resolver/encoder assembly comprising a resolver; a flexible circuit board; electronic circuitry for decoding the resolver being formed in at least one integrated circuit chip mounted on said flexible circuit board; a tubular enclosure; said integrated circuit chip and circuit board being received in said enclosure adjacent an inner wall of said enclosure; said resolver being mounted in said enclosure separate and spaced from said circuit board; and said integrated circuit chip being insulated from said resolver and from said enclosure.

5. A compact digital resolver/encoder comprising: a resolver; a flexible circuit board having an inner side and an outer side; a number of electronic components for decoding said resolver being mounted on said flexible printed circuit board; a generally cylindrical container having a cylindrical wall; said circuit board being received in said container, being folded into a shape which will fit into said container around said resolver, being insulated on said inner side from said resolver, and being insulated on said outer side from said cylindrical wall of said container; said resolver being received in said container separate from said circuit board and being spaced a predetermined distance from said printed circuit board; and an electrical connection including flexible insulated wire conductors coupling said resolver to said printed circuit board.

6. A compact digital resolver/encoder comprising: a resolver; a flexible circuit board having an inner side and an outer side; a number of electronic components for decoding the resolver being mounted on said flexible printed circuit board; a tubular enclosure; said circuit board being received in said tubular enclosure, and being folded into a shape which will fit into said enclosure and around said resolver, being insulated on said inner side from said resolver, and being insulated on said outer side from said enclosure; said resolver being received in said enclosure separate from said circuit board and being spaced a predetermined distance from said printed circuit board; and an electrical connection including flexible insulated wire conductors coupling said resolver to said printed circuit board.

* * * * *